(12) United States Patent
Mubenga

(10) Patent No.: US 12,355,278 B2
(45) Date of Patent: Jul. 8, 2025

(54) EFFICIENCY MEASURING APPARATUS, ACTIVE EQUALIZER INDUCTOR DESIGN TOOL AND EQUALIZER DESIGN APP

(71) Applicant: Ngalula Sandrine Mubenga, Toledo, OH (US)

(72) Inventor: Ngalula Sandrine Mubenga, Toledo, OH (US)

(*) Notice: Subject to any disclaimer, the term of this patent is extended or adjusted under 35 U.S.C. 154(b) by 825 days.

(21) Appl. No.: 17/646,933

(22) Filed: Jan. 4, 2022

(65) Prior Publication Data

US 2022/0311249 A1   Sep. 29, 2022

Related U.S. Application Data

(60) Provisional application No. 63/167,471, filed on Mar. 29, 2021.

(51) Int. Cl.
*H02J 7/00* (2006.01)
*H03K 3/017* (2006.01)

(52) U.S. Cl.
CPC ........ *H02J 7/0016* (2013.01); *H02J 7/00711* (2020.01); *H03K 3/017* (2013.01)

(58) Field of Classification Search
CPC ......... H02J 50/70; H02J 50/50; H02J 7/0013; H02J 7/00; H02J 2310/48; H02J 7/0044; H02J 7/007194; H02J 7/342; H02J 7/0014; H02J 7/0025; H02J 2300/30; H02J 7/0068; H02J 7/00034; H02J 7/35; H02J 50/10; H02J 7/0047; H02J 7/00036; H02J 7/0019; H02J 7/007182; H02J 7/0016; H02J 50/05; H02J 50/402; H01M 2010/4271; H01M 10/482; H01M 10/4257; H01M 2220/10; H01M 2220/20; B60L 53/65; B60L 58/10; B60L 50/64
USPC ................................................. 320/118–125
See application file for complete search history.

(56) References Cited

U.S. PATENT DOCUMENTS

| | | | |
|---|---|---|---|
| 8,183,870 B1* | 5/2012 | Davies ............... | H01M 10/4207 323/248 |
| 8,896,315 B1* | 11/2014 | Davies ................. | H02J 7/0016 320/120 |
| 2020/0185931 A1* | 6/2020 | Stuart ................... | H02J 7/0019 |

OTHER PUBLICATIONS

Ngalula Sandrine Mubenga, P.E.; A Dissertation entitled: A lithium-Ion Battery Management System with Bilevel Equalization; 204 pages; Dec. 2017.

(Continued)

*Primary Examiner* — Binh C Tat
(74) *Attorney, Agent, or Firm* — Shumaker, Loop & Kendrick, LLP; James D. Miller

(57) ABSTRACT

An efficiency measuring apparatus that measures the efficiency of charge transfer between battery cell sections in an active EQU unit. The apparatus includes a pair of series connected battery cell sections, a first FET switch and a second FET switch. The apparatus further includes an inductor electrically coupled between the cell sections, to the drain terminal of the first FET switch and the source terminal of the second FET switch. The apparatus also includes a gate driver electrically coupled to the gate terminal of the first FET switch, and an oscillator providing a PWM signal to the gate driver, where the gate driver opens and closes the first FET switch to transfer charge from the one cell section to the other one cell section through the inductor.

15 Claims, 7 Drawing Sheets

(56) References Cited

OTHER PUBLICATIONS www.mdpi.com/journal/batteries; Ngalula Sandrine Mubenga, Zachary Linkous and Thomas Stuart, A Bilevel Equalizer for Large Lithium Ion Batteries; Published Dec. 7, 2017.

Ngalula Sandrine Mubenga and Thomas Stuart; A Low Cost Hybrid Equalizer for Lithium Ion Bess; 8 pages.

Ngalula Sandrine Mubenga and Thomas Stuart; A Bilevel Equalizer for Lithium Ion Batteries; 4 pages.

www.mdpi.com/journal/batteries; Ngalula Sandrine Mubenga, Kripa Sharma and Thomas Stuart; A Bilevel Equalizer to Boost the Capacity of Second Life Li Ion Batteries; Published Aug. 1, 2019.

https://www.mdpi.com/journal/electricity; Ngalula Sandrine Mubenga, Boluwatito Salami and Thomas Stuart; Bilevel vs. Passive Equalizers for Second Life EV Batteries; Published Feb. 7, 2021.

\* cited by examiner

Step 1. Design Specifications
Enter the system specifications: operating voltage V, inductor peak current I pk and frequency f

| V(V) | Ipk(A) | f(Hz) | Pin(w) |
|------|--------|-------|--------|
| 14.4 | 9.75 | 3731 | 35.1 |

The Inductance L is $L = V/(2*f*Ipk)$     197.93 uH

Step 2. Select the inductor cores and determine the number of turns N
$N = 1000*\sqrt{L/c*L1000}$

| | Part# | Page | Sheet# | #cores c | L1000 turns for 1 core | L(mH) | N |
|---|---|---|---|---|---|---|---|
| Design 1 | | 504.3434305 | MP-0500026-2 | 1 | 12 | 0.20 | 128 |
| Design 2 | | 302.045645 | MP-06.3026-2 | 1 | 19 | 0.20 | 102 |
| Design 3 | | 213.5850466 | MP-068026-2H127 | 1 | 38 | 0.20 | 72 |
| Design 4 | | 202.3901631 | MP-080026-2H127 | 1 | 28 | 0.20 | 84 |
| Design 5 | | 197.6398378 | MP-092026-2 | 1 | 22 | 0.20 | 95 |
| Design 6 | | 151.7537673 | MP-106026-2 | 1 | 32 | 0.20 | 79 |

Step 3. Determine the DC Saturation (u>75% ui)
Le, eff Path Length (cm)   H, DC mag. Force (Oe)

| | Le, eff Path Length (cm) | H, DC mag. Force (Oe) | a | b | c | d | %ui | delta u (%) |
|---|---|---|---|---|---|---|---|---|
| Design 1 | 3.12 | 504.3434305 | 1.000E-02 | 1.980E-06 | 1.662 | 0.14.116 | | -85.88 |
| Design 2 | 4.14 | 302.045645 | 1.000E-02 | 1.980E-06 | 1.662 | 0.27.817 | | -72.18 |
| Design 3 | 4.14 | 213.5850466 | 1.000E-02 | 1.980E-06 | 1.662 | 0.40.67 | | -59.33 |
| Design 4 | 5.09 | 202.3901631 | 1.000E-02 | 1.980E-06 | 1.662 | 0.42.466 | | -57.15 |
| Design 5 | 5.88 | 197.6398378 | 1.000E-02 | 1.980E-06 | 1.662 | 0.43.815 | | -56.19 |
| Design 6 | 6.35 | 151.7537673 | 1.000E-02 | 1.980E-06 | 1.662 | 0.54.746 | | -45.25 |

From Fig.6A

Step 4. Predict inductor core losses
$B = (V \times 10^8) / N \times A \times C \times Z \times F$ (gauss)
Core eff.area Ae

| Design | Core vol. (cm3) | a | b | c | d | Bpk(G) | P loss(W) | Eff. |
|---|---|---|---|---|---|---|---|---|
| Design 1 | 0.114 | 0.356 | 1913E+09 | 4.349E+08 | 4.331E+06 | 8.850E-14 | 13181 | 1.665 | 95.26% |
| Design 2 | 0.232 | 0.961 | 1913E+09 | 4.349E+08 | 4.331E+06 | 8.850E-14 | 8150.1 | 1.901 | 94.58% |
| Design 3 | 0.464 | 1.921 | 1913E+09 | 4.349E+08 | 4.331E+06 | 8.850E-14 | 5762.8 | 2.023 | 94.24% |
| Design 4 | 0.452 | 2.3 | 1913E+09 | 4.349E+08 | 4.331E+06 | 8.850E-14 | 5077.8 | 1.920 | 93.53% |
| Design 5 | 0.388 | 2.28 | 1913E+09 | 4.349E+08 | 4.331E+06 | 8.850E-14 | 5243.7 | 2.019 | 94.25% |
| Design 6 | 0.654 | 4.15 | 1913E+09 | 4.349E+08 | 4.331E+06 | 8.850E-14 | 3751.7 | 1.975 | 94.37% |

Step 5 Computes winding losses and inductor efficiency
Datasheet (22AWG mag wire per default)
Max value after coating Results

| | Height(in) | OD(in) | ID | Rdc(Ω) | Single Turns | Lt | Ω/in | Lt_c | Rdc_c | P_win | P_L | Efficiency |
|---|---|---|---|---|---|---|---|---|---|---|---|---|
| Design 1 | 0.217 | 0.53 | 2.750E-01 | 2.660E-02 | 2.400E+1 | 0.689 | 0.0016 | 0.689 | 0.14234325 | 4.51050173 | 6.176 | 82.41% |
| Design 2 | 0.28 | 0.71 | 3.550E-01 | 4.700E-02 | 3.200E+1 | 0.915 | 0.0016 | 0.915 | 0.149900625 | 4.74997605 | 6.651 | 81.05% |
| Design 3 | 0.53 | 0.71 | 3.550E-01 | 6.850E-02 | 3.200E+1 | 1.415 | 0.0015 | 1.415 | 0.154488906 | 4.89536722 | 6.918 | 80.29% |
| Design 4 | 0.53 | 0.83 | 4.750E-01 | 9.770E-02 | 4.400E+1 | 1.415 | 0.0016 | 1.415 | 0.186695818 | 5.91592374 | 7.836 | 77.68% |
| Design 5 | 0.382 | 0.956 | 5.420E-01 | 9.930E-02 | 5.100E+1 | 1.178 | 0.0017 | 1.178 | 0.184678529 | 5.8520009 | 7.871 | 77.58% |
| Design 6 | 0.472 | 1.09 | 5.550E-01 | 3.980E-02 | 3.300E+1 | 1.479 | 0.0006 | 1.479 | 0.073406667 | 2.32607375 | 4.301 | 87.75% |

RECOMMENDATION
Implement Design

*FIG - 6B*

EFFICIENCY MEASURING APPARATUS, ACTIVE EQUALIZER INDUCTOR DESIGN TOOL AND EQUALIZER DESIGN APP

CROSS REFERENCE TO RELATED APPLICATIONS

This application claims the benefit of the filing date of U.S. Provisional Application No. 63/167,471, titled, Efficiency Measuring Apparatus, Active Equalizer Inductor Design Tool And Equalizer Design App, filed Mar. 29, 2021.

BACKGROUND

Field

This disclosure relates generally to an efficiency measuring apparatus that measures the efficiency of charge transfer between battery cell sections and, more particularly, to an efficiency measuring apparatus that measures the efficiency of charge transfer between battery cell sections in an active equalizer (EQU) unit.

Discussion of the Related Art

Climate change has become one of the most important global challenges that both developing and developed nations face in the $21^{st}$ century. In the electric power sector, renewable energy, such as solar and wind, has emerged and in the transportation sector, electric vehicles (xEV) have emerged as viable solutions to help fight climate change. Electric vehicles and renewable energy systems usually employ battery energy storage systems (BESS). Most BESSs employ lithium-ion batteries because of their high energy density, good cycling life, superior power density and no memory effect. These batteries typically include several battery cells electrically coupled in series to provide the power and energy requirements. The battery cells may be grouped into battery modules, where each module may include a certain number of cells, and where the cells in a module are electrically coupled in series and/or parallel. The number of cells in a module and the number of modules depends on battery technology and application. For example, for lithium-ion type battery modules it is common to have twelve cells electrically coupled in series in a module.

As a result of many factors, such as cell self-discharge rate, internal cell resistance, electrical connections, battery aging, etc., the state-of-charge (SOC) of the cells in a battery may drift apart during operation of the battery over time. A battery management system (BMS) may be employed to monitor the voltage thresholds, impedance, state-of-health and SOC of each battery cell and the temperature of the battery, and control how much the battery can be charged and discharged based on the SOC of the maximum charged cell and the minimum charged cell. The battery cannot be used to provide power if the cell with the lowest SOC drops below some minimum SOC because that cell may become damaged, and the battery cannot be over-charged beyond some maximum SOC for the cell with the highest SOC because that cell may become overheated and damaged. Thus, a cell with a low SOC may prevent the battery from being used even though the other cells may have a suitable or significant SOC.

A BMS usually includes an electronic equalizer (EQU) to balance the cell voltages. Currently there are two types of EQUs, namely, passive and active EQUs. A passive EQU monitors the weakest cell (lowest voltage), and removes charge from the other cells by dissipating their energy as heat through shunt resistors until all of the cell voltages equal the weakest cell voltage. This leads to energy loss (heating), reduced capacity and poor performance. In spite of this, the vast majority of users prefer to use passive EQUs because they are inexpensive. An active EQU transfers charge from one cell to another cell to balance the cell voltages. This results in reduced energy loss, increased capacity and higher performance for the battery. Although active EQUs have higher performance, they are relatively expensive. As a result, very few users use active EQUs.

Current BMSs employ either a passive EQU or an active EQU, but not both. Bilevel equalizers (BEQ), which consist of both an active EQU and a passive EQU, have been proposed that balance the cell voltages at two different levels and provide high performance close to an active EQU, but at a low cost like a passive EQU. For example, a lithium-ion battery may include a large number of cells connected in series, e.g., 96 cells. The BEQ organizes the battery into sections of a few cells each, e.g., 4-12. For example, a 96 cell battery might be organized into 16 sections of 6 cells each. The voltages of the 6 cells in each section are balanced by a passive EQU for that section, and the 16 section voltages are balanced by an active EQU. As a result, a weak cell in a section only drags down the other cells within that section, instead of all of the cells in the battery. The active EQU then transfers charge to the weakest section from the other sections. As a result, the battery capacity is increased to a level close to that for an active EQU. The BEQ has a lower cost than the active EQU because of the lower number of active EQU units, e.g., 15 for the BEQ (number of sections −1) vs. 96 for an active EQU in the previous 96 cell example. However, in order to manufacture and commercialize a BEQ, there is a need to develop a suite of design aid tools to effectively design the BEQ.

SUMMARY

This disclosure discusses and describes an efficiency measuring apparatus that measures the efficiency of charge transfer between battery cell sections in an active EQU unit. The apparatus includes a pair of series connected DC voltage supplies representing battery cell sections, a first FET switch including a gate terminal, a drain terminal and a source terminal, where the source terminal of the first FET switch is electrically coupled to one of the cell sections, and a second FET switch including a gate terminal, a drain terminal and a source terminal, where the source and gate terminals of the second FET switch are electrically coupled and the drain terminal of the second FET switch is electrically coupled to the other one of the cell sections. The apparatus further includes an inductor electrically coupled between the cell sections, to the drain terminal of the first FET switch and the source terminal of the second FET switch. The apparatus also includes a gate driver electrically coupled to the gate terminal of the first FET switch, and an oscillator providing a pulse width modulation (PWM) signal to the gate driver, where the gate driver opens and closes the first FET switch to transfer charge from the one cell section to the other one cell section through the inductor.

Additional features of the present disclosure will become apparent from the following description and appended claims, taken in conjunction with the accompanying drawings.

BRIEF DESCRIPTION OF THE DRAWINGS

FIGS. 6A and 6B are a spreadsheet illustrating an example of using an inductor design tool for selecting an inductor for an active EQU unit;

DETAILED DESCRIPTION OF THE EMBODIMENTS

The following discussion of the embodiments of the disclosure an efficiency measuring apparatus that measures the efficiency of charge transfer between battery cell sections is merely exemplary in nature, and is in no way intended to limit the disclosure or its applications or uses.

Figure 1:
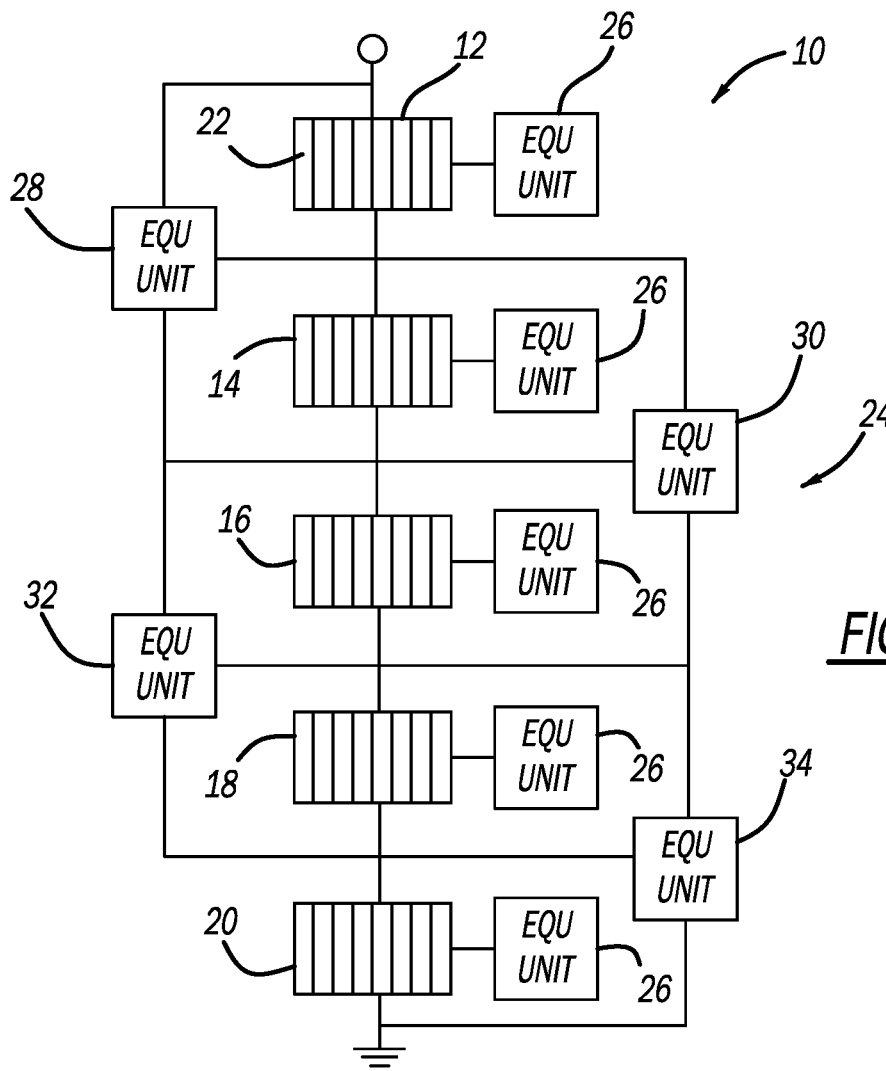
FIG. 1 is a schematic block diagram of a battery system including a number of battery sections each having a number of battery cells and including a BEQ.

FIG. 1 is a schematic block diagram of a battery system 10 including five battery sections 12, 14, 16, 18 and 20 each having a certain number of battery cells 22. The battery system 10 also includes a BEQ 24 having a passive EQU unit 26 for each battery section 12-20, and a plurality of active EQU units 28, 30, 32 and 34, where the active EQU unit 28 is provided between the battery sections 12 and 14, the active EQU unit 30 is provided between the battery sections 14 and 16, the active EQU unit 32 is provided between the battery sections 16 and 18 and the active EQU unit 34 is provided between the battery sections 18 and 20. The BEQ 24 operates in a well known manner, such as described above.

Figure 2:
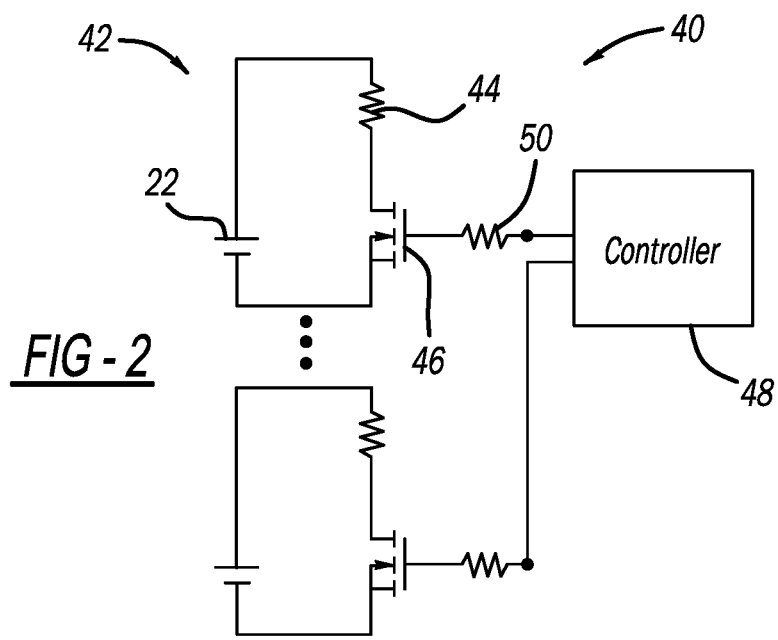
FIG. 2 is a schematic diagram of a passive EQU unit employed in the BEQ shown in FIG. 1.

FIG. 2 is a representative schematic diagram 40 of, for example, one of the passive EQU units 26 that includes an EQU circuit 42 for each cell 22 in the particular battery section 12-20. Each EQU circuit 42 includes a resistor 44 and an FET switch 46 electrically coupled in series. When the FET switch 46 is closed by a controller 48, the cell 22 is discharged through a discharge resistor 50 and the discharge voltage is measured by the controller 48.

Figure 3:
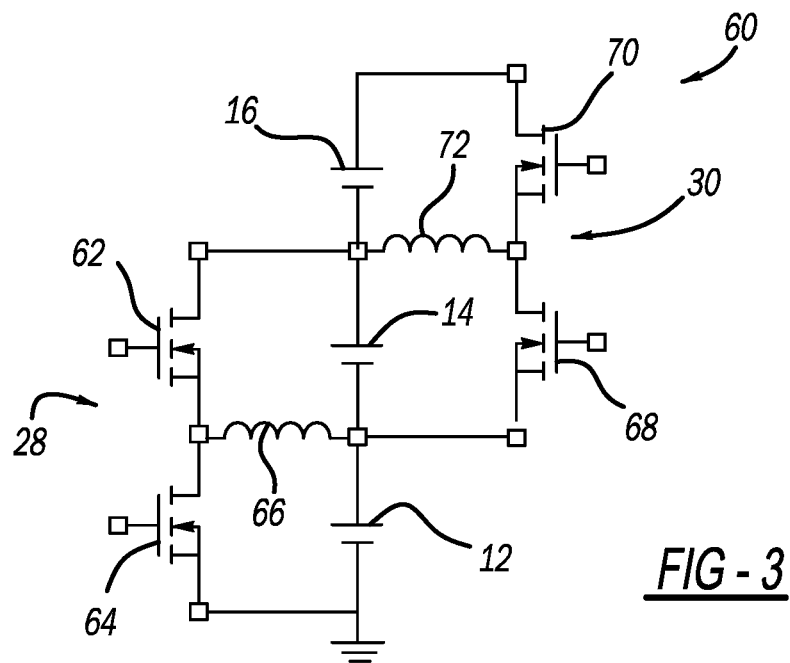
FIG. 3 is a schematic diagram of an active EQU unit employed in the BEQ shown in FIG. 1.

FIG. 3 is a representative schematic diagram 60 of, for example, the active EQU units 28 and 30. The EQU unit 28 includes a pair of FET switches 62 and 64 and an inductor 66 and the EQU unit 30 includes a pair of FET switches 68 and 70 and an inductor 72. The FET switches 62, 64, 68 and 70 are closed and opened to charge and discharge the inductors 66 and 72 to transfer charge between the battery sections 12, 14 and 16 so that the sections 12, 14 and 16 have the same or similar SOC in a manner well understood by those skilled in the art.

Figure 4:
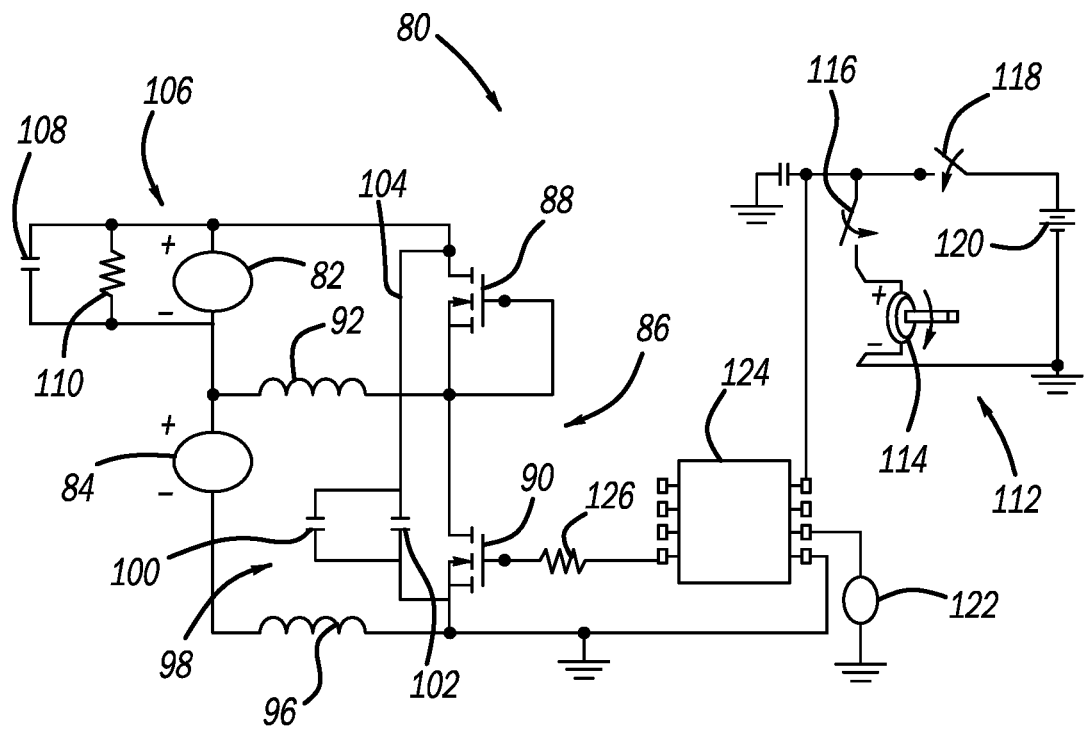
FIG. 4 is a schematic diagram of an efficiency measuring apparatus for low power batteries.

FIG. 4 is a schematic diagram of an efficiency measuring apparatus 80 that measures the efficiency of charge transfer between battery cell sections 82 and 84 each including up to six cells or 24V. The apparatus 80 includes an active EQU circuit 86 having FET switches 88 and 90 and an inductor 92 that transfers charge between the battery cell sections 82 and 84, where the battery cell section 84 has the highest capacity and the battery cell section 82 has the lowest capacity. The FET switch 90 takes charge away from the high capacity battery cell section 84 and the body diode in the FET switch 88 charges the low capacity battery cell section 82. The FET switches 88 and 90 alternate being on and off.

The source terminal of the FET switch 88 is coupled to the drain terminal of the FET switch 90 and one side of the inductor 92, the drain terminal of the FET switch 88 is coupled to the positive side of the battery cell section 82, the source terminal of the FET switch 90 is coupled to the negative side of the battery cell section 84 through a parasitic inductor 96, and the negative side of the battery cell section 82 and the positive side of the battery cell section 84 are coupled to the other side of the inductor 92. A snubber circuit 98 including an electrolytic capacitor 100 and a ceramic capacitor 102 is coupled in parallel with a line 104 coupling the drain terminal of the FET switch 88 and the source terminal of the FET switch 90. An RC filter circuit 106 including an electrolytic capacitor 108 and a resistor 110 is coupled in parallel with the battery cell section 82. A fan circuit 112 for cooling the apparatus 80 includes a fan 114, a fan switch 116, a main switch 118 and a power source 120.

An oscillator 122 provides a pulse width modulation (PWM) signal to a gate driver 124 that provides a drive signal through a resistor 126 to the gate terminal of the FET switch 90 that closes the FET switch 90 when the PWM signal is high and opens the FET switch 90 when the PWM signal is low. When the FET switch 90 closes, current flows clockwise in the loop made up of the FET switch 90, the battery cell section 84 and the inductor 92, which stores charge in the inductor 92 from the battery cell section 84. When the FET switch 90 opens, the charge stored in the inductor 92 flows through the body diode of the FET switch 88, which causes current flow counter-clockwise in the loop made up of the inductor 92, the FET switch 88 and the battery cell section 82, which charges the battery cell section 82. When the FET switch 90 is gated off, the drain-to-source voltage of the FET switch 90 has a high transient overshoot, and thus the snubber circuit 98 limits the voltage increase. The voltages on the battery cell sections 82 and 84 can be measured during the charge transfer by an oscilloscope (not shown) to provide the charging efficiency.

Figure 5:
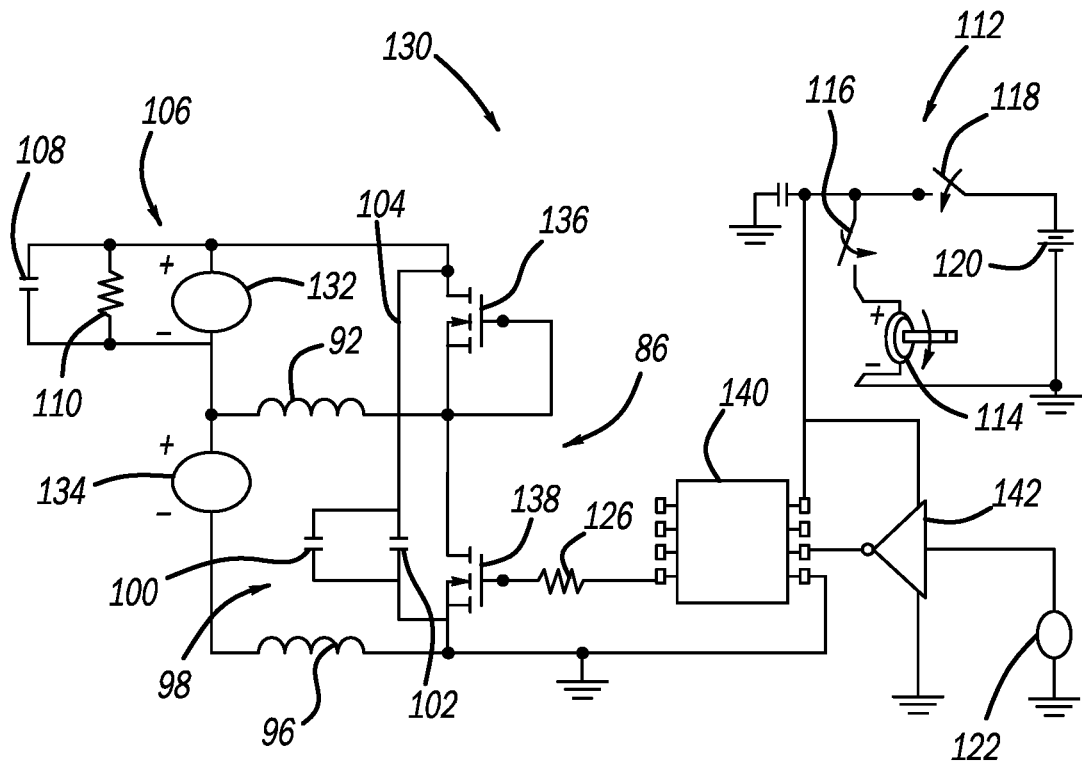
FIG. 5 is a schematic diagram of an efficiency measuring apparatus for high power batteries.

FIG. 5 is a schematic diagram of another more robust efficiency measuring apparatus 130 that measures the efficiency of charge transfer between battery cell sections 132 and 134 that include up to twelve cells or 48V, where like elements to the apparatus 80 are identified by the same reference numbers. The apparatus 130 requires more robust FET switches 136 and 138 and a more robust gate driver 140 than the apparatus 80 because of the higher voltages. The more robust gate driver 140 has an inverted low input at pin 3, which requires the PWM signal from the oscillator 122 to be inverted by an inverter 142 before being sent to the gate driver 140.

The inductor 92 in the active EQU circuit 86 stores energy during cell equalization and is the main factor that determines the energy transfer efficiency from the battery cell section 84 to the battery cell section 82. The inductor 92 has winding losses due to the resistance of the coil and core losses because of hysteresis and eddy current mechanisms. If the inductor 92 generates too much loss, then the charge transfer efficiency decreases. Therefore, in order to maximize the charge transfer efficiency between the battery cell sections 84 and 82, the inductor 92 should be properly designed to maximize the charge transfer efficiency between the cell sections 84 and 82. In addition, various inductor designs should be compared prior to selecting the inductor 92. The following discussion describes an inductor design tool that can be used for this purpose particularly referencing the apparatus 80 with the understanding it equally applies to the apparatus 130.

FIGS. 6A and 6B are a spreadsheet illustrating an example of using the inductor design tool for selecting the inductor 92 for the active EQU circuit 86. At step 1, the designer enters the design specifications of the active EQU circuit 86 including the operating voltage V, the inductor peak current lpk and the frequency f, and the tool calculates the inductor power P and the required inductance L. At step 2, the tool provides available inductor core designs from which a desirable core design can be selected and using the inductance L calculates the number of winding turns N for each core design and/or a selected core design. At step 3, the tool provides the level of saturation for each core design and/or the selected core design. At step 4, the tool predicts the inductor core losses for each core design and/or the selected core design. At step 5, the tool predicts the winding losses, the total inductor losses and inductor efficiency for each core design and/or the selected core design. Once the user has decided which inductor to use in the active EQU circuit 86 using the tool, then that inductor is used as the inductor 92 in the efficiency measuring apparatus 80.

An FET switch design tool can also be employed to select the proper FET switches 88 and 90 to be used in the efficiency measuring apparatus 80. Specifically, conduction losses $P_{C1}$ and switching losses $P_{SW}$ in the FET switches 88 and 90 are considered for providing an effective active EQU circuit 86. The conduction losses $P_{C1}$ occur when an FET switch 88 or 90 is on and conducts current. The key parameter responsible for conduction losses $P_{C1}$ is the resistance between the drain and source terminals of the FET switches 88 and 90. To accurately model the conduction losses $P_{C1}$, it is necessary to understand the mode of operation of the active EQU circuit 86 on the apparatus 80. The active EQU circuit 86 operates in three phases that are dependent on the status of the FET switches 88 and 90. In phase 1, the drive signal from the gate driver 124 is high, and this turns the FET switch 90 on while the FET switch 88 is off. In phase 2, the drive signal from the gate driver 124 is low, and this turns the FET switch 90 off while the body diode of the FET switch 88 conducts. In phase 3, both of the FET switches 88 and 90 are off. There is no inductor current and no energy is transferred through the active EQU circuit 86. In phase 1, the conduction losses $P_{C1}$ can be estimated by multiplying the duty cycle D, the average FET switch current Irms and the FET drain-to-source resistance $R_{DS(ON)}$ as specified on the datasheet as:

$$P_{c1} = Irms^2 \times R_{DS(on)} \times D,$$

where Irms is the rms current flowing through the gate terminal of the FET switch 88 or 90.

In phase 2, the body diode of the FET switch 88 is conducting and the conduction loss $P_{C2}$ can be estimated as:

$$P_{c2} = I_2 \times V_f \times (1-D),$$

where D is the duty cycle, $l_2$ is the current flowing from the inductor 92 to the FET switch 88 and $V_f$ is the diode forward voltage as specified on the datasheet.

The total conduction losses $P_c$ can be estimated by adding $P_{c1}$ and $P_{c2}$ as:

$$P_c = P_{c1} + P_{c2}.$$

The switching losses $P_{SW}$ occur when the FET switches 88 and 90 transition between the on and off states. The switching losses $P_{SW}$ increase as the switching frequency increases because the transition period becomes a larger portion of the duty cycle D. The FET switch 88 has parasitic capacitances between the ground-to-source terminals CGS and the drain-to-source terminals CDS. When the FET switch 90 is turned off, the inductance L and the capacitance CDS of the FET switch 88 form a series LC resonant circuit that produces high frequency oscillations. When the FET switch 88 is turned on, the capacitance CGS must be charged first before the on state is reached. Thus, during turn on, the time to charge this capacitance is $t_{SW(ON)}$ and it can be found from the FET datasheet. Similarly, during turn off, the time to discharge the capacitance CGS is $t_{SW(OFF)}$. The switching losses $P_{SW}$ can be estimated by:

$$P_{SW} = 0.5 \times V_{DS} \times I_{pk} \times (t_{SW(ON)} + t_{SW(OFF)}) \times f,$$

where $I_{PK}$ is the peak current, $t_{SW(ON)}$ is the turn-on transition time, $t_{SW(OFF)}$ is the turn-off transition time, f is the operating frequency and $V_{DS}$ is the peak voltage of the FET switch 88 or 90 during the off state.

Figure 7:
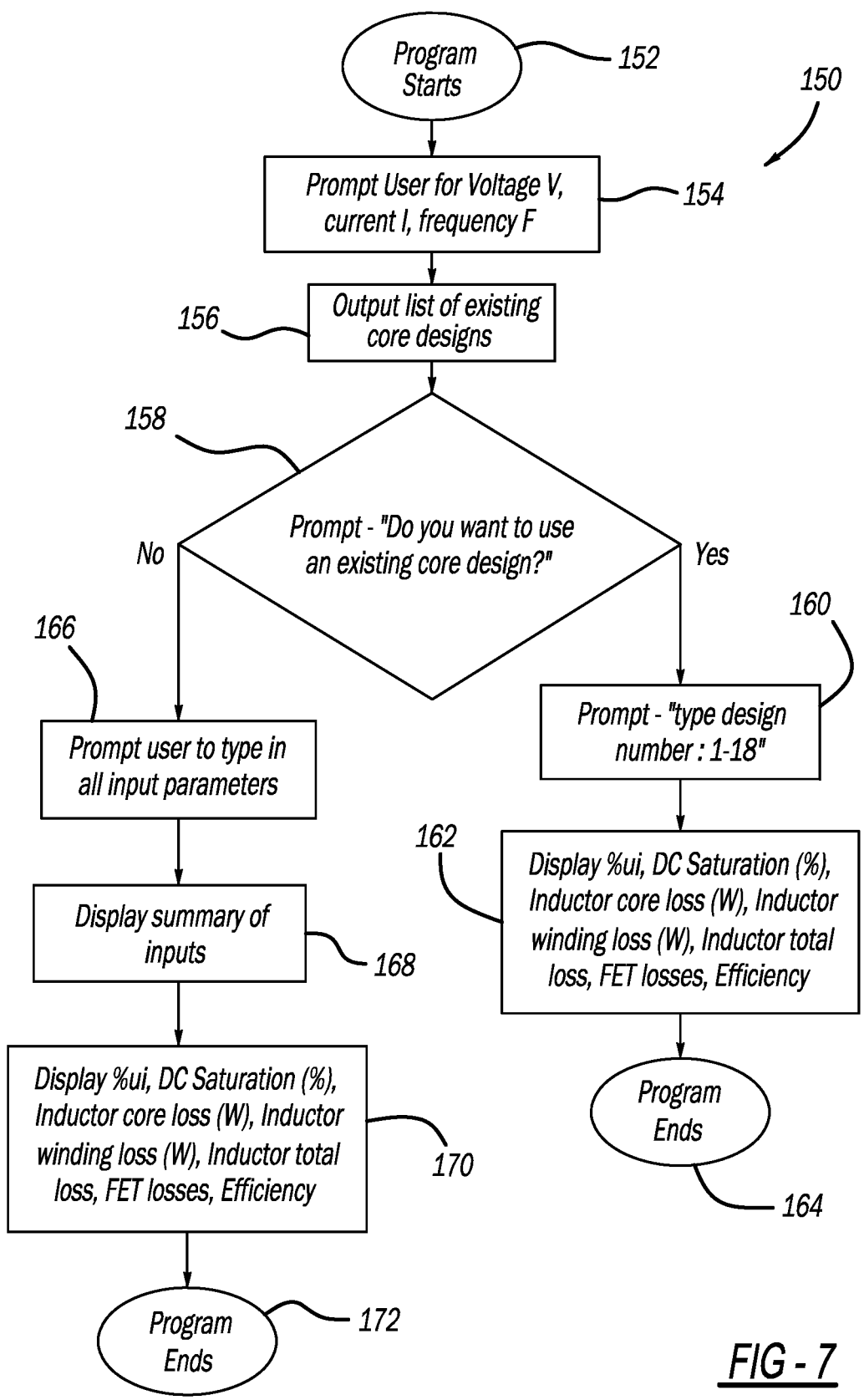
FIG. 7 is a flow chart diagram showing a process for using the inductor design tool.

FIG. 7 is a flow chart diagram 150 showing a computer and software process for implementing the inductor and FET switch design tools described above. The process starts at oval 152 and the tool prompts the user to input the voltage, current and frequency at box 154. The tool outputs a list of available inductor core designs at box 156 and then prompts the user to determine whether the user wants to us an existing core design at decision diamond 158. If the user does want to use an existing core design at the decision diamond 158, then the tool prompts the user to select the core design at box 160. The tool then calculates and displays the inductor saturation, the DC saturation, inductor core loss, the inductor winding loss, the inductor total loss, the FET switch losses and the inductor efficiency at box 162, and the tool ends at box 164. If the user does not want to use existing core designs at the decision diamond 158, then the tool prompts the user to provide the input parameters for the desired inductor at box 166, which are displayed at box 168. The tool then calculates and displays the inductor saturation, the DC saturation, inductor core loss, the inductor winding loss, the inductor total loss, the FET switch losses and the inductor efficiency at box 170, and the tool ends at box 172.

Figure 8:
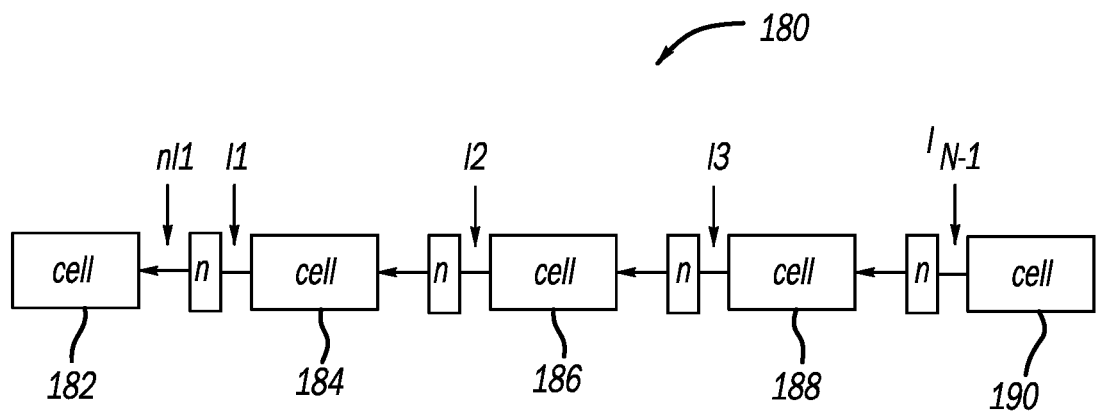
FIG. 8 is a graphical model showing current flow for charge transfer in an active EQU unit.

Once the FET switches 88 and 90 and the inductor 92 are selected for the active EQU circuit 86, an active EQU design app can be employed to simulate the performance of the active EQU circuit 86 on the battery cell sections 82 and 84. The app can also predict the size of the equalization currents. This is crucial for understanding the design parameters of the active EQU circuit 86 needed to balance the battery cell sections 82 and 84. FIG. 8 is a graphical model 180 of current flow in the active EQU circuit 86 showing how much charge is transferred between the battery cell sections 82 and 84, represented as battery cell sections 182, 184, 186, 188 and 190, where Ah is discharge capacity, I is the equalization current and n is the charge transfer efficiency calculated by the apparatus. In this example, section 182 is the weakest section, and thus current flows from the section 190 to the section 182.

The discussion below explains the development of a mathematical model for a BEQ, where the mathematical model provides a basis for designing the BEQ and creating the Matlab code for the design. As stated earlier, the BEQ consists of passive EQU units and active EQU units. The passive EQU units equalize the cells in a section and the active EQU units transfer charge from section to section.

During the charge cycle, both the passive EQU units and the active EQU units operate on the battery. The passive EQU unit does not add charge to the section, so it has no use during the discharge cycle. During the discharge cycle, the active EQU units alone balance the sections.

The battery contains M cells connected in series. The BEQ divides the battery into the cell sections 182-190 in the model 180, which corresponds to the battery sections 12, 14, 16, 18 and 20 in the battery system 10. Each section 182-190 will typically contain either 4, 6 or 12 cells. The battery will have N sections, where N is the number of sections for the BEQ as:

$N$=Total number of cells in the stack/Number of cells

The convention is that the capacity of a section 182-190 is the capacity of the weakest cell within that section. The system variables are Ahi=rated discharge capacity Ah of section i (2 to N), ampere-hours; Ahw=Ah1=discharge capacity of the weak section, ampere-hours; u=level of unbalance of the weak cell as a portion of the rated discharge capacity Ah, 0 to 0.99; Id=discharge current, amperes; Ipi=DC passive EQU unit current for all of the cells in section I, amperes; t=discharge time, hours; Ik=DC active EQU unit current flowing from one section to another section (k=N−1), amperes; and n=efficiency of each active EQU unit, 0 to 1.00.

During the discharge cycle, weak cells discharge faster than other cells, but the BEQ is designed so that the higher capacity sections will simultaneously transfer charge to the weak sections so that the entire battery, sections 182-190, will be fully discharged at the same time t. The mathematical model for the BEQ during the discharge cycle is shown in FIG. 8. This example is for the case where the active EQU unit current flows from right to left.

| | |
|---|---|
| $(Id+Ip1-n\times I1)t=Ah1$ | Section 182 |
| $(Id+Ip2+I1-n\times I2)t=Ah2$ | Section 184 |
| $(Id+Ip3+I2-n\times I3)t=Ah3$ | Section 186 |
| $(Id+Ip4+I3-n\times I4)t=Ah4$ | Section 188 |
| $(Id+Ip5+I4)t=Ah5$ | Section 190 |

Generalization for any number of sections N yields the mathematical model for the BEQ below:
For $1 \leq I \leq N-1$:

$(Id+Ipi+Ii-1-n\times Ii)t=Ahi$   Section i

For the last section i=N:

$(Id+IpN+IN-1)t=AhN$   Section N

As stated above, there is no passive EQU unit equalization during the discharge cycle, therefore:

$Ip1=Ip2=\ldots=IpN=0$

The inverse time variable P is defined as:

$P=1/t$

Rearranging the equations above yields the mathematical model of the BEQ in matrix form as:

$$\begin{bmatrix} n & 0 & 0 & 0 & Ah1 \\ -1 & n & 0 & 0 & Ah2 \\ 0 & -1 & n & 0 & Ah3 \\ 0 & 0 & -1 & n & Ah4 \\ 0 & 0 & 0 & -1 & Ah5 \end{bmatrix} \cdot \begin{bmatrix} I1 \\ I2 \\ I3 \\ I4 \\ P \end{bmatrix} = \begin{bmatrix} Id \\ Id \\ Id \\ Id \\ Id \end{bmatrix}$$

The matrix form for a system with N battery sections is:

$$\begin{bmatrix} n & 0 & 0 & 0 & Ah1 \\ -1 & & & & . \\ . & & & & . \\ 0 & 0 & -1 & n & Ah_{N-1} \\ 0 & 0 & 0 & -1 & AhN \end{bmatrix} \cdot \begin{bmatrix} I1 \\ . \\ . \\ I_{N-1} \\ P \end{bmatrix} = \begin{bmatrix} Id \\ Id \\ Id \\ Id \\ Id \end{bmatrix}$$

TO section S1, S2, ..., SN

FROM current $I1\ I2\ \ldots\ IN-1$   $AhN$

The current flows from the high capacity section to the low capacity section. The convention for the current direction Idr follows.

For current leaving the section, Idir=−1.
For current entering the section, Idir=+1.

Figure 9:
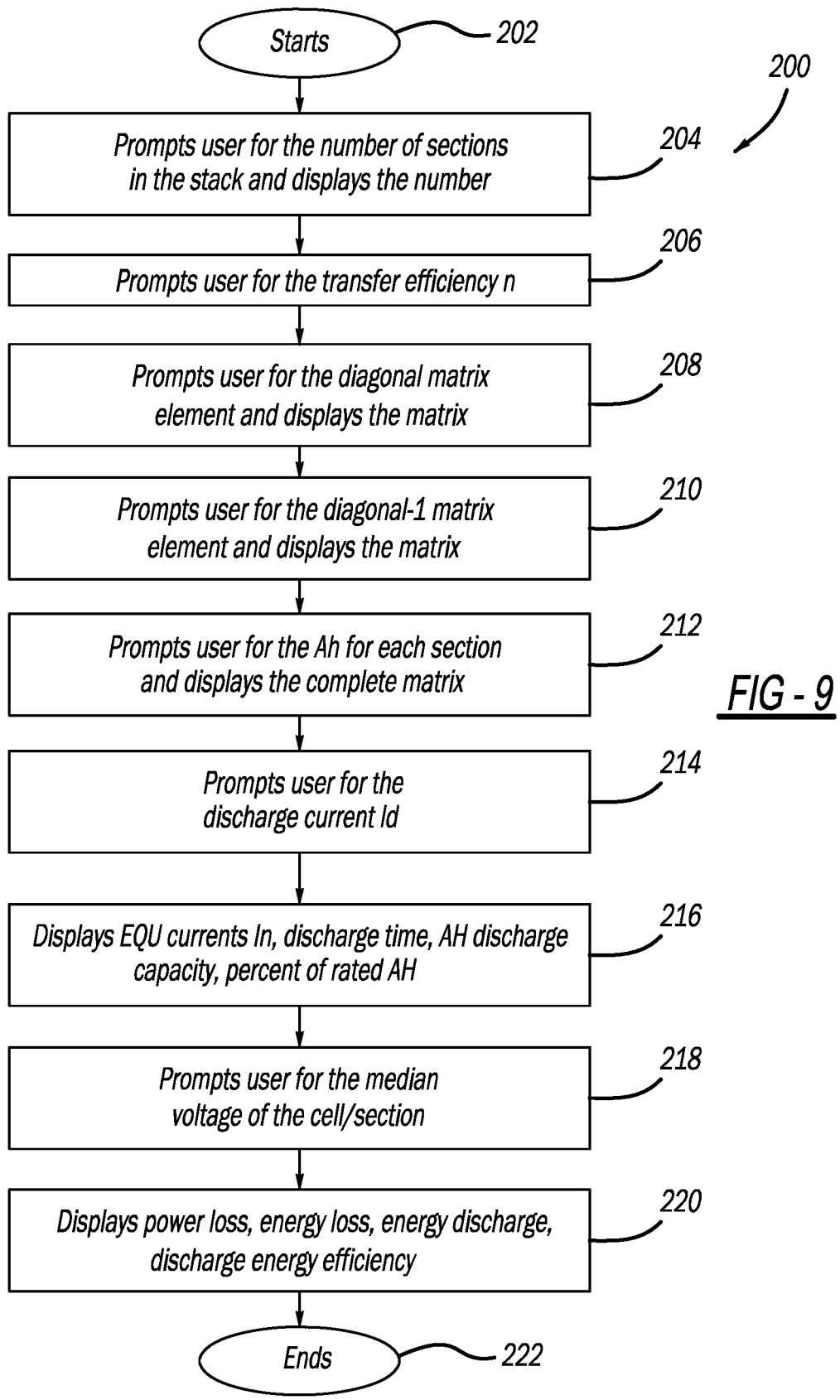
FIG. 9 is a flow chart diagram showing a computer and software process for implementing an active EQU unit design app.

FIG. 9 is a flow chart diagram 200 showing a computer and software process for implementing the active EQU design app (EDA) discussed above. The app starts at oval 202 and then prompts the user for the number of sections in the battery and displays that number at box 204. For example, how many sections are in the battery? Display 6.

The app then prompts the user for the EQU transfer efficiency variable n at box 206. For example, what is the efficiency? Enter a value from 0.0 to 1.0, for example, 0.7569.

The app then prompts the user for the diagonal matrix element and displays the matrix at box 208. The system has N sections.

The app then prompts the user for the diagonal −1 matrix element and displays the matrix at box 210. For example, ENTER 0 FOR THE LAST ENTRY In.

CONVENTION: Efficiency range is 0-0.99.
Current direction Idir(n) is (+) for current I entering the section N and (−) for current I leaving the section N.
Current flows from a high capacity section to a low capacity section.
The entry should be of the form [Ef(1)*Idir(1) Ef(2)*Idir(2) . . . Ef(n−1)*Idirn(n−1) 0].
[0.7569 0.7569 0.7569 0.7569 0.7569 0]
D=
0.7569 0 0 0 0 0
0 0.7569 0 0 0 0
0 0 0.7569 0 0 0
0 0 0 0.7569 0 0
0 0 0 0 0.7569 0
0 0 0 0 0 0

The app then prompts the user for the current direction at the box 210 and displays the matrix, which are the diagonal −1 matrix elements. Current direction for each active EQU unit current.

E.g contribution of active EQU unit current I into the section 184, I2 into the section 186 . . . I(n−1) into the section 190.
Current direction is +1 for I leaving a section and −1 for I entering a section.
The entry should be of the form of [Idir(1) Idir(2) . . . Idir(n−1)].
[−1 −1 −1 −1 −1]
D2=
0.7569 0 0 0 0 0
−1.0000 0.7569 0 0 0 0
0 −1.0000 0.7569 0 0 0
0 0 −1.0000 0.7569 0 0
0 0 0 −1.0000 0.7569 0

0 0 0 0 −1.0000 0

The app then prompts the user for the discharge capacity Ah and displays the Ah values at box 212. LAST COLUMN VECTOR ENTRY Enter the capacity in amp-hour for each section from the section 182 to the section 190.

The entry should be of the form of [AH1; AH2; . . . ; AHn].

[44.8;64;51.2;64;64;64]

A=

0.7569 0 0 0 0 44.8000
−1.0000 0.7569 0 0 0 64.0000
0 −1.0000 0.7569 0 0 51.2000
0 0 −1.0000 0.7569 0 64.0000
0 0 0 −1.0000 0.7569 64.0000
0 0 0 0 −1.0000 64.0000

The app then prompts the user for the discharge current $I_d$ at box 214. What is the discharge current $I_d$? 16

The app then displays the EQU currents $I_n$, discharge time, discharge capacity Ah and percent of rated discharge capacity Ah at box 216. For example.

1: EQU current is 4.24 A
2: EQU current is 2.61 A
3: EQU current is 5.28 A
4: EQU current is 3.98 A
5: EQU current is 2.27 A The discharge time is 3.5035 hours.

AH Discharge is 56.056 AH.

Percent of Rated AH is 87.59.

The app then prompts the user for the medium voltage of the cell section at box 218, for example, what is the cell medium voltage? 14.4.

The app then displays the power loss, energy loss, energy discharge and discharge energy efficiency at box 220, and the app ends at oval 222.

As will be well understood by those skilled in the art, the several and various steps and processes discussed herein to describe the disclosure may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An efficiency measuring apparatus that measures the efficiency of charge transfer between battery cells and groups of battery cells, said apparatus comprising:
   a pair of series connected battery cell sections;
   a first FET switch including a gate terminal, a drain terminal and a source terminal, wherein the source terminal of the first FET switch is electrically coupled to one of the cell sections;
   a second FET switch including a gate terminal, a drain terminal and a source terminal, wherein the source and gate terminals of the second FET switch are electrically coupled and the drain terminal of the second FET switch is electrically coupled to the other one of the cell sections;
   an inductor electrically coupled between the cell sections, to the drain terminal of the first FET switch and the source terminal of the second FET switch;
   a gate driver electrically coupled to the gate terminal of the first FET switch; and
   an oscillator providing a pulse width modulation (PWM) signal to the gate driver, wherein the gate driver opens and closes the first FET switch to transfer charge from the one cell section to the other one of the cell sections through the inductor.

2. The apparatus according to claim 1 wherein the source terminal of the first FET switch is electrically coupled to the drain terminal of the second FET switch by a line.

3. The apparatus according to claim 2 further comprising a snubber circuit coupled to the line, wherein the snubber circuit limits the drain terminal to source terminal voltage when the first FET switch is gated off.

4. The apparatus according to claim 3 wherein the snubber circuit includes a pair of capacitors electrically coupled in parallel.

5. The apparatus according to claim 4 wherein one of the capacitors is an electrolytic capacitor and the other capacitor is a ceramic capacitor.

6. The apparatus according to claim 1 further comprising an inverter, said inverter being responsive to the PWM signal form the oscillator, inverting the PWM signal and providing the inverted PWM signal to the gate driver.

7. The apparatus according to claim 1 further comprising an RC filter circuit electrically coupled in parallel with the other one of the cell sections.

8. The apparatus according to claim 1 wherein the first and second FET switches and the inductor make up an active battery cell equalization circuit.

9. The apparatus according to claim 1 wherein a type of the first and second FET switches and the gate driver are selected based on the voltage of the battery cell sections.

10. The apparatus according to claim 9 wherein the battery cell sections have a voltage of 24 volts or less.

11. The apparatus according to claim 9 wherein the battery cell sections have a voltage of 48 volts or less.

12. An efficiency measuring apparatus that measures the efficiency of charge transfer between battery cells and groups of battery cells, said apparatus comprising:
    a pair of series connected battery cell sections;
    a first FET switch including a gate terminal, a drain terminal and a source terminal, wherein the source terminal of the first FET switch is electrically coupled to one of the cell sections;
    a second FET switch including a gate terminal, a drain terminal and a source terminal, wherein the source and gate terminals of the second FET switch are electrically coupled and the drain terminal of the second FET switch is electrically coupled to the other one of the cell sections;
    an inductor electrically coupled between the cell sections, to the drain terminal of the first FET switch and the source terminal of the second FET switch;
    a gate driver electrically coupled to the gate terminal of the first FET switch; and
    a snubber circuit coupled to the first and second FET switches, said snubber circuit limiting the drain terminal to source terminal voltage when the first FET switch is gated off.

13. The apparatus according to claim 12 wherein the snubber circuit includes a pair of capacitors electrically coupled in parallel.

14. The apparatus according to claim 13 wherein one of the capacitors is an electrolytic capacitor and the other capacitor is a ceramic capacitor.

15. An efficiency measuring apparatus that measures the efficiency of charge transfer between battery cells and groups of battery cells, said apparatus comprising:
- a pair of series connected battery cell sections;
- a first FET switch including a gate terminal, a drain terminal and a source terminal, wherein the source terminal of the first FET switch is electrically coupled to one of the cell sections;
- a second FET switch including a gate terminal, a drain terminal and a source terminal, wherein the source and gate terminals of the second FET switch are electrically coupled and the drain terminal of the second FET switch is electrically coupled to the other one of the cell sections;
- an inductor electrically coupled between the cell sections, to the drain terminal of the first FET switch and the source terminal of the second FET switch;
- a gate driver electrically coupled to the gate terminal of the first FET switch; and
- an RC filter circuit electrically coupled in parallel with the other one of the cell sections.

* * * * *